United States Patent Office 3,340,164
Patented Sept. 5, 1967

3,340,164

METHOD OF COPPER PLATING ANODIZED ALUMINUM

Julius Zimmerman, Brooklyn, N.Y., assignor to Sperry Rand Corporation, Ford Instrument Company Division, Long Island City, N.Y., a corporation of Delaware No Drawing. Filed Dec. 26, 1963, Ser. No. 333,739
4 Claims. (Cl. 204—35)

This invention relates to a method and composition for the electroless plating of copper, and more particularly to the copper plating of electrically nonconductive substrates such as anodized aluminum sheets useful for the production of printed circuit elements.

Various methods are known for the electroless deposition of copper layers by chemical reduction. Such methods generally involve use of baths containing dissolved copper salts, formaldehyde, and caustic soda. Such methods have not been entirely satisfactory in that the plating solutions employed are relatively unstable and, moreover, when a substrate plated with copper deposited from such a bath is placed in an electrolytic plating bath for further copper deposition, peeling, lifting or blistering of the chemically deposited copper layer frequently occurs.

It is accordingly among the objects of the present invention to provide a method for copper plating by chemical reduction which is economical to perform, and which permits increasing the thickness of the copper layer by further plating operations without peeling, lifting, blistering or otherwise impairing the initial copper plating.

A further object of the invention is to provide such a method which is particularly useful for copper plating an anodized layer on an aluminum substrate without damaging the underlying anodized film.

Another object of the invention is to provide a composition for copper plating, which composition possesses improved stability characteristics permitting its use as a copper plating bath for longer durations than feasible with heretofore known plating solutions.

The nature and objects of the invention will be more fully apparent from a consideration of the following detailed description of a preferred embodiment thereof.

It has been found that improved electroless copper plating may be effected by a procedure involving contacting the surface to be plated with a plating composition comprising an aqueous solution containing from about .11 to 1.1 moles per liter of an aldehyde polymer reducing agent such as paraformaldehyde, trioxane or paraacetaldehyde, from about 0.003 to 0.02 mole per liter of dissolved copper ions and from about .02 to .08 mole per liter of potassium hydroxide. The part to be copper plated, e.g., an anodized aluminum plate or other electrically nonconductive substrate useful for the preparation of a printed circuit board, is immersed in the plating bath with the latter maintained at a temperature below about 100° F. to prevent decomposition thereof, for a period of from about 15 minutes to 1 hour, preferably for about 30 minutes, to plate out a thin copper layer upon the substrate.

The part may subsequently be placed in an electroplating bath in order to increase the thickness of the copper layer thereon and thereafter treated by photoetching or other known techniques for the formation of printed circuit patterns thereon. Alternatively, the thin copper layer deposited from the electroless plating bath of the present invention may be directly subjected to photoetching, silk screen printing or other techniques for the formation of printed circuit patterns thereon.

The plating bath of the present invention incorporates an aldehyde polymer which effects reduction of copper salts present in the bath to copper metal for deposition upon the substrate treated. It has been found that the aldehyde polymer reducing agent imparts improved stability to the plating bath than heretofore possible employing formaldehyde-containing plating baths. Hence, while baths incorporating formaldehyde frequently decompose within a period of from about ½ to 1 hour, it has been found that baths incorporating either paraformaldehyde, trioxane or paraacetaldehyde aldehyde polymers are stable for several days prior to decomposition. Preferably, symmetrical trioxane is employed because of its superior solubility characteristics in aqueous systems.

The plating bath hereof additionally includes, as an alkali component, potassium hydroxide rather than the caustic soda employed in previously known electroless copper plating baths. It has been found that baths containing the latter material attack anodic films on aluminum substrates, producing leakage paths which may lead to short circuiting of printed circuits subsequently formed thereon. The potassium hydroxide-containing plating baths of the present invention, on the other hand, do not attack anodic films and are particularly suitable for copper plating of anodized layers on aluminum substrates.

The copper plating bath provided in accordance herewith preferably comprises a composition having the following formulation:

| Ingredient: | Amount, grams/liter |
|---|---|
| Copper sulfate | 1.5 to 10 |
| Rochelle salt (potassium sodium tartrate) | 3 to 20 |
| Potassium hydroxide | 1 to 4 |
| Aldehyde polymer | 10 to 100 |

It is preferred to employ the method and composition of the present invention for copper plating anodized films on aluminum substrates, e.g., those films which have been sealed in accordance with the method described in copending application Ser. No. 333,654, filed concurrently herewith, entitled Sealant for Anodized Aluminum Films. The sealing step is carried out, as more fully indicated in the above application, by initially treating the anodized layer on the aluminum substrate with an aqueous solution of colloidal silica or ethyl silicate, and thereafter applying a coating of an organopolysiloxane thereto and baking the substrate to seal the pores of the anodized layer. The pretreatment is suitably effected by immersing the anodized layer in an aqueous solution containing from 0.5 to 50 weight percent of the colloidal silica or ethyl silicate, as the case may be, maintained at a temperature of from 100° F. to the boiling point of the solution, for a period of from five to sixty minutes.

The substrate to be plated may be initially sensitized prior to immersion in the plating bath by treatment with stannous salts and/or salts of silver, gold, platinum or palladium in a manner known in the art. Preferably, the substrate is initially treated with a stannous salt such as stannous chloride, and thereafter subjected to a further treatment with a salt of silver, gold, platinum or palladium, e.g., palladium chloride. It is believed that the stannous salt forms a coordination complex with free oxygen atoms present in the substrate, the noble metal ion thereafter bonding to the stannous ion and forming a complex sensitizer catalyzing the deposition of the desired copper layer thereon. It will, however, be understood that the present invention is not to be limited by this proposed explanation of the operation of a preferred embodiment thereof.

The following examples illustrate procedures employed in accordance with preferred embodiments of the present invention:

*Example 1*

An aluminum part was degreased in a vapor phase degreaser, thereafter sprayed, under a pressure of 10 p.s.i.g., with a water stream containing alumina, and rinsed in water to insure thorough cleaning of the part. The substrate was thereafter immersed in a 15% sulfuric acid anodizing bath, maintained in such bath at a temperature of 85° F. for a period of 45 minutes, and thereafter rinsed in water.

The anodized part was sealed in accordance with the procedure of the aforesaid application Ser. No. 333,654. Initially, the part was immersed in a boiling aqueous solution containing 1.0 weight percent of colloidal silica (Du Pont "Ludox HS") for a period of 30 minutes. The coated substrate was then removed from the boiling colloidal silica solution, rinsed in water at room temperature, and thereafter washed in methanol to remove the residual water from the coating.

The coated part was then dipped in a bath containing 2 parts by weight of a gamma-aminopropylpolysiloxane containing silicon-bonded ethoxy groups (obtained by hydrolyzing gamma-aminopropyltriethoxysilane with an amount of water insufficient to react with all of the silicon-bonded ethoxy groups present on the starting silane, and subsequently condensing the hydrolyzate so formed to produce the desired polymer in the manner described in U.S. Patent No. 3,085,908), and one part methanol.

The part was retained in the siloxane-containing dipping bath for 5 minutes and then removed, air dried for 10 minutes and thereafter baked at a temperature between 250° and 300° F. for 30 minutes to cure the silicone coating and simultaneously seal the pores of the anodized film.

The sealed anodized aluminum substrate was abraded with a fine abrasive paper (Minnesota Mining No. 400 "Wet or Dry") and subjected to a water rinse.

The surface was then sensitized by immersion for between 1 and 2 minutes in a 2% aqueous solution of stannous chloride, acidified with hydrochloric acid. After again rinsing, the sensitization was completed by immersion of the treated part for ½ minute in an acidified aqueous solution of palladium chloride containing ½ gram of palladium chloride per liter of solution.

After immersion in a further aqueous rinse bath the part was dipped, at room temperature, in a copper plating bath having the following composition:

| Ingredient: | Amount, grams/liter |
|---|---|
| Copper sulfate (anhydrous) | 3 |
| Rochelle salt | 8 |
| Potassium hydroxide | 3 |
| Symmetrical trioxane | 15 |
| Water (to make 1 liter of solution). | |

After 45 minutes the anodized substrate was removed from the copper plating bath and a copper layer having an estimated thickness of between .0003 and .0005 inch produced.

After rinsing the plated part, it was immersed in a conventional electrolytic copper plating bath having a current density of 30 amperes per square foot. The thickness of the copper layer was increased in the plating bath to about .002 inch, without the production of accompanying defects such as peeling, lifting, or blistering of the plated layer, or the like.

*Example 2*

A ceramoplastic substrate (e.g., a glass bonded mica) was cleaned and then sensitized by immersion for 5 minutes in a 2% aqueous solution of stannous chloride, followed by immersion for ½ minute in a 0.05% aqueous solution of palladium chloride.

The part was then immersed in a copper plating bath having the composition as stated in Example 1.

After 45 minutes immersion in the bath a copper layer having a substantially uniform 0.0004 inch thickness was produced on the ceramoplastic substrate.

It will be noted that the present invention provides a method for copper plating various substrates which is simple and economical to carry out, and which produces copper layers which are not subject to peeling, lifting, blistering or like defects when subsequently immersed in electrolytic plating baths for the purpose of increasing copper film thicknesses, and to chemical reduction plating solutions useful in such method which possess markedly greater stability characteristics than proprietary electroless copper plating baths heretofore known.

Since various changes may be made in the described embodiments of the invention without departing from the scope thereof, it is intended that the preceding description should be interpreted as illustrative and not in a limiting sense.

The embodiments of the invention in which an exclusive privilege or property is claimed are defined as follows:

1. A method of producing printed circuit elements on anodized aluminum sheets comprising:
   (a) sealing an anodized layer on an aluminum substrate by immersing the anodized layer in an aqueous solution containing a material selected from the group consisting of colloidal silica and ethyl silicate;
   (b) applying a coating of an organopolysiloxane thereto and baking the substrate to seal the pores of the anodized layer thereon;
   (c) sensitizing the anodized surface with a stannous salt and a second material selected from the group consisting of palladium, platinum, and gold; and
   (d) contacting the sealed layer with a plating bath maintained at a temperature below 100° F., said bath comprising an aqueous solution of from 0.11 to 1.1 moles/liter of aldehyde polymer reducing agent selected from the group consisting of para-formaldehyde, trioxane and para-acetaldehyde; from 0.003 to 0.02 mole/liter of dissolved copper ions; and from 0.02 to 0.08 mole/liter of potassium hydroxide.

2. The method of claim 1 wherein said silica film is formed by treating the anodized layer with an aqueous solution containing from 0.5 to 50 weight percent colloidal silica, at a temperature of from 100° F. to the boiling point of said solution, for a period of from five to sixty minutes.

3. The method of claim 1 wherein said silica film is formed by treating the anodized layer with an aqueous solution of from 0.5 to 50 weight percent of ethyl silicate maintained at a temperature of from 100° F. to the boiling point of the solution for a period of from five to sixty minutes.

4. The method of claim 1 wherein said plating bath consists essentially of:

| Ingredient: | Amount, grams/liter |
|---|---|
| Copper sulfate | 1.5 to 10 |
| Rochelle salt | 3 to 20 |
| Potassium hydroxide | 1 to 4 |
| Aldehyde polymer | 10 to 100 |

(References on following page)

References Cited

UNITED STATES PATENTS

| | | | |
|---|---|---|---|
| 2,383,653 | 8/1945 | Kirk | 117—169 |
| 2,537,433 | 1/1951 | Waring | 117—132 |
| 2,575,141 | 11/1951 | Smith-Johannsen | 117—132 X |
| 2,879,183 | 3/1959 | Doherty et al. | 117—75 X |
| 2,938,805 | 5/1960 | Agens | 106—1 |
| 2,965,551 | 12/1960 | Richaud | 117—130 |
| 3,033,703 | 5/1962 | Schneble et al. | 117—47 |
| 3,075,856 | 1/1963 | Lukes | 106—1 X |
| 3,085,908 | 4/1963 | Morehouse et al. | 117—132 X |
| 3,095,309 | 6/1963 | Zeblisky et al. | 117—130 X |
| 3,174,916 | 3/1965 | Cohn | 204—35 |
| 3,274,078 | 9/1966 | Tsuji | 204—35 |

OTHER REFERENCES

Saubestre, C. B.: Electroless Plating Today, in Metal Finishing, 60(7), pp. 51–53, July 1962.

ALFRED L. LEAVITT, *Primary Examiner.*

J. R. BATTEN, *Examiner.*